(12) United States Patent
Tomoyasu

(10) Patent No.: US 7,153,387 B1
(45) Date of Patent: Dec. 26, 2006

(54) PLASMA PROCESSING APPARATUS AND METHOD OF PLASMA PROCESSING

(75) Inventor: Masayuki Tomoyasu, Nirasaki (JP)

(73) Assignee: Tokyo Electron Limited, Tokyo-To (JP)

( * ) Notice: Subject to any disclaimer, the term of this patent is extended or adjusted under 35 U.S.C. 154(b) by 321 days.

(21) Appl. No.: 10/049,989

(22) PCT Filed: Aug. 11, 2000

(86) PCT No.: PCT/JP00/05408

§ 371 (c)(1),
(2), (4) Date: Feb. 20, 2002

(87) PCT Pub. No.: WO01/15212

PCT Pub. Date: Mar. 1, 2001

(30) Foreign Application Priority Data

Aug. 20, 1999 (JP) .................................. 11-234198

(51) Int. Cl.
H01L 21/00 (2006.01)
(52) U.S. Cl. .............................. 156/345.47; 118/723 E
(58) Field of Classification Search ............ 118/723 E, 118/723 R; 315/111.21; 156/345.43, 345.44, 156/345.45, 345.46, 345.47
See application file for complete search history.

(56) References Cited

U.S. PATENT DOCUMENTS 6,142,096 A * 11/2000 Sakai et al. ............... 118/723 E
6,155,202 A * 12/2000 Nakano et al. ........... 118/723 E
6,359,250 B1   3/2002 Blonigan et al.

FOREIGN PATENT DOCUMENTS

EP   0 663 682 A1   7/1995
EP   0 930 642      7/1999

(Continued)

OTHER PUBLICATIONS

PCT Notification of Transmittal of Copies of Translation of the International Preliminary Examination Report (PCT/IB/338) issued for PCT/JP00/05408.

(Continued)

Primary Examiner—Parviz Hassanzadeh
Assistant Examiner—Michelle Crowell
(74) Attorney, Agent, or Firm—Smith, Gambrell & Russell, LLP

(57) ABSTRACT

There is provided a plasma processing system and method capable of decreasing the non-uniformity of a field distribution on the surface of an electrode and making the density of plasma uniform, in a plasma processing using a high density plasma which can cope with a further scale down. First and second electrodes 21 and 5 are provided in a chamber so as to face each other. A feeder plate 52 is arranged so as to be slightly spaced from the opposite surface of a surface serving as a feeding plane of the first electrode facing the second electrode 5. A feeder rod 51 is connected to the feeder plate 52 at a position which is radially shifted from a position corresponding to the center of the feeding plane of the first electrode 21. The feeder plate 52 is rotated to rotate the feeding position of the feeder rod 51 on the feeding plane of the first electrode. A high frequency electric power is thus fed to form a high frequency electric field between the first and second electrodes 21 and 5 to form plasma to plasma-process a substrate W.

38 Claims, 7 Drawing Sheets

FOREIGN PATENT DOCUMENTS

| | | |
|---|---|---|
| JP | 3-206613 | 9/1991 |
| JP | 05013343 A * | 1/1993 |
| JP | 5-29273 | 2/1993 |
| JP | 05198390 A * | 8/1993 |
| JP | 6-333697 | 12/1994 |
| JP | 10-32171 | 2/1998 |
| WO | WO 00/03415 | 1/2000 |

OTHER PUBLICATIONS

International Preliminary Examination Report (PCT/IPEA/409) (translated) issued for PCT/JP00/05408.

Supplementary European Search Report issued in connection with EP 00 95 1961, dated Nov. 9, 2005.

* cited by examiner

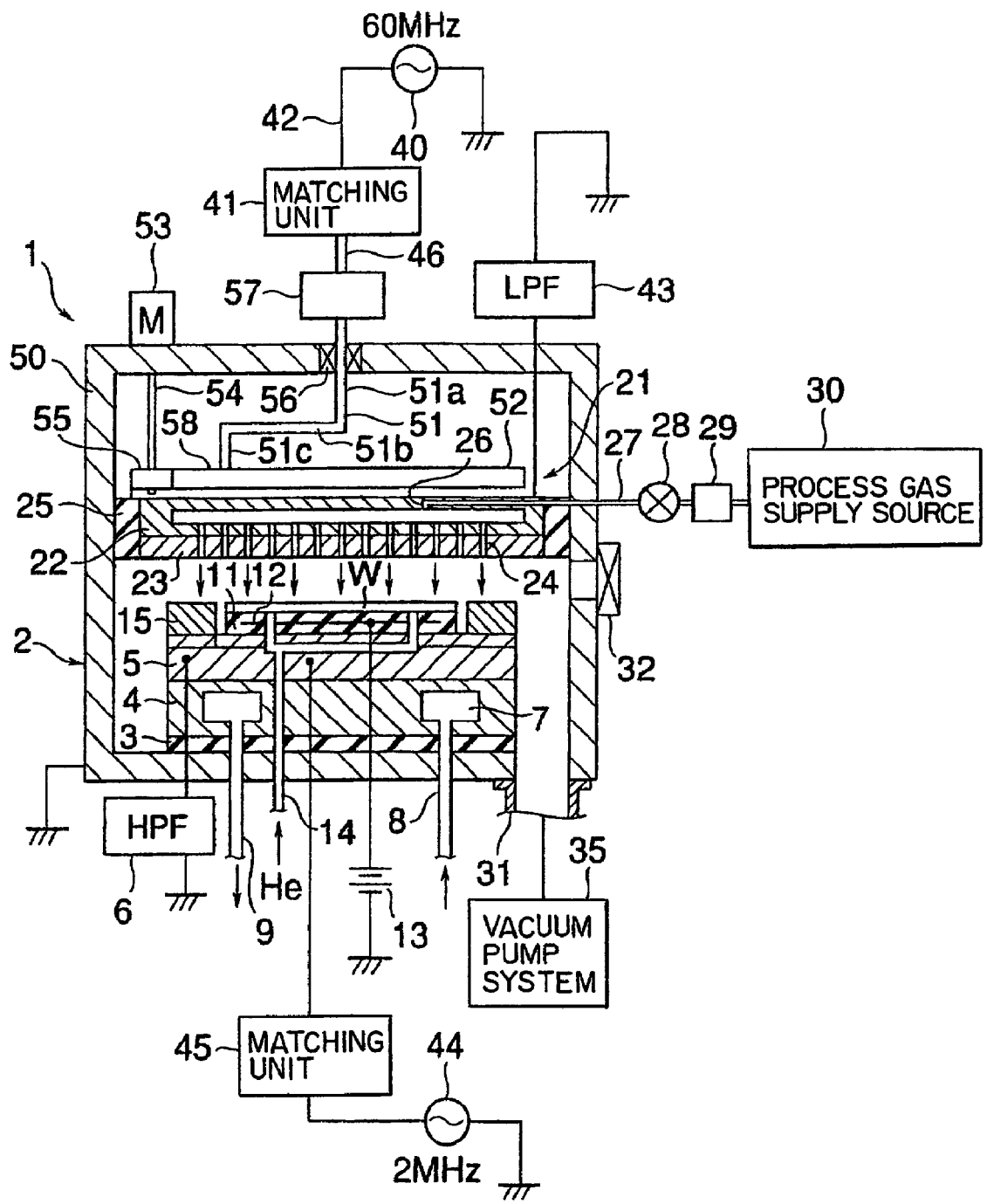
F I G. 1

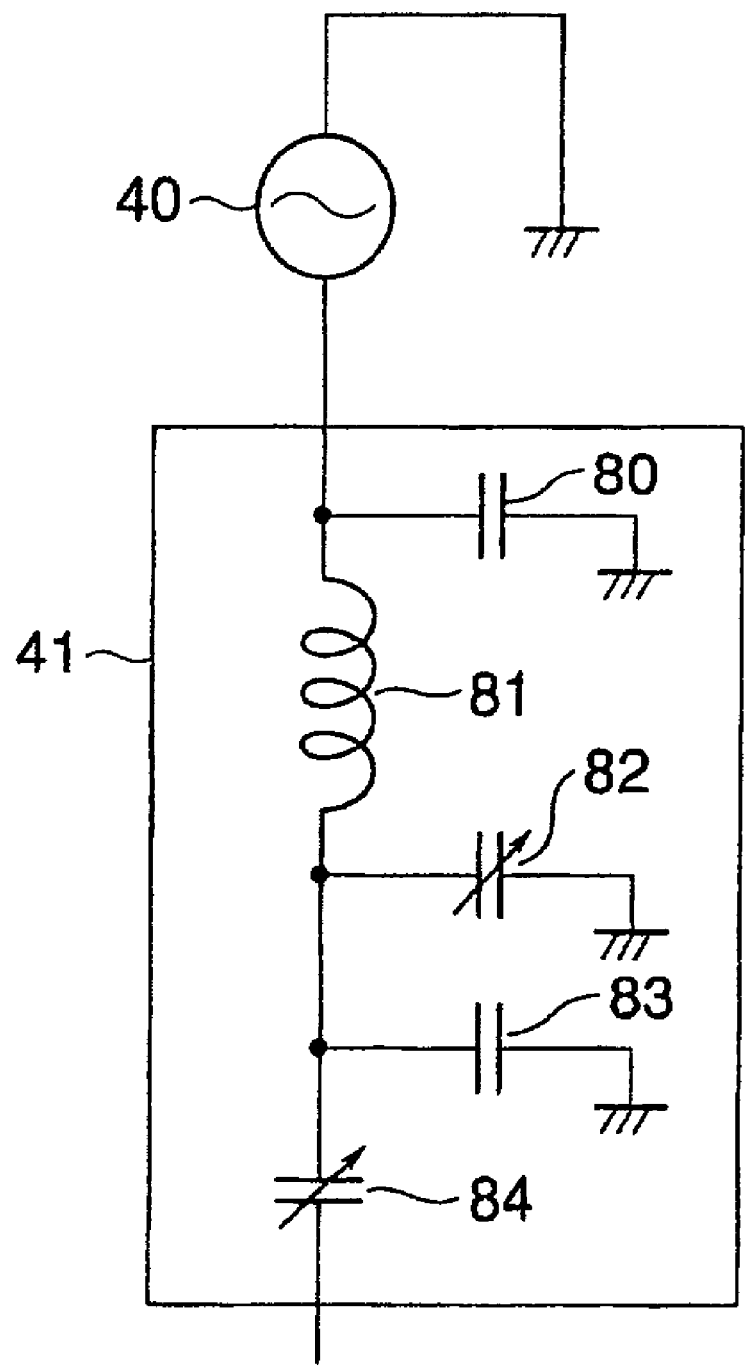
F I G. 6

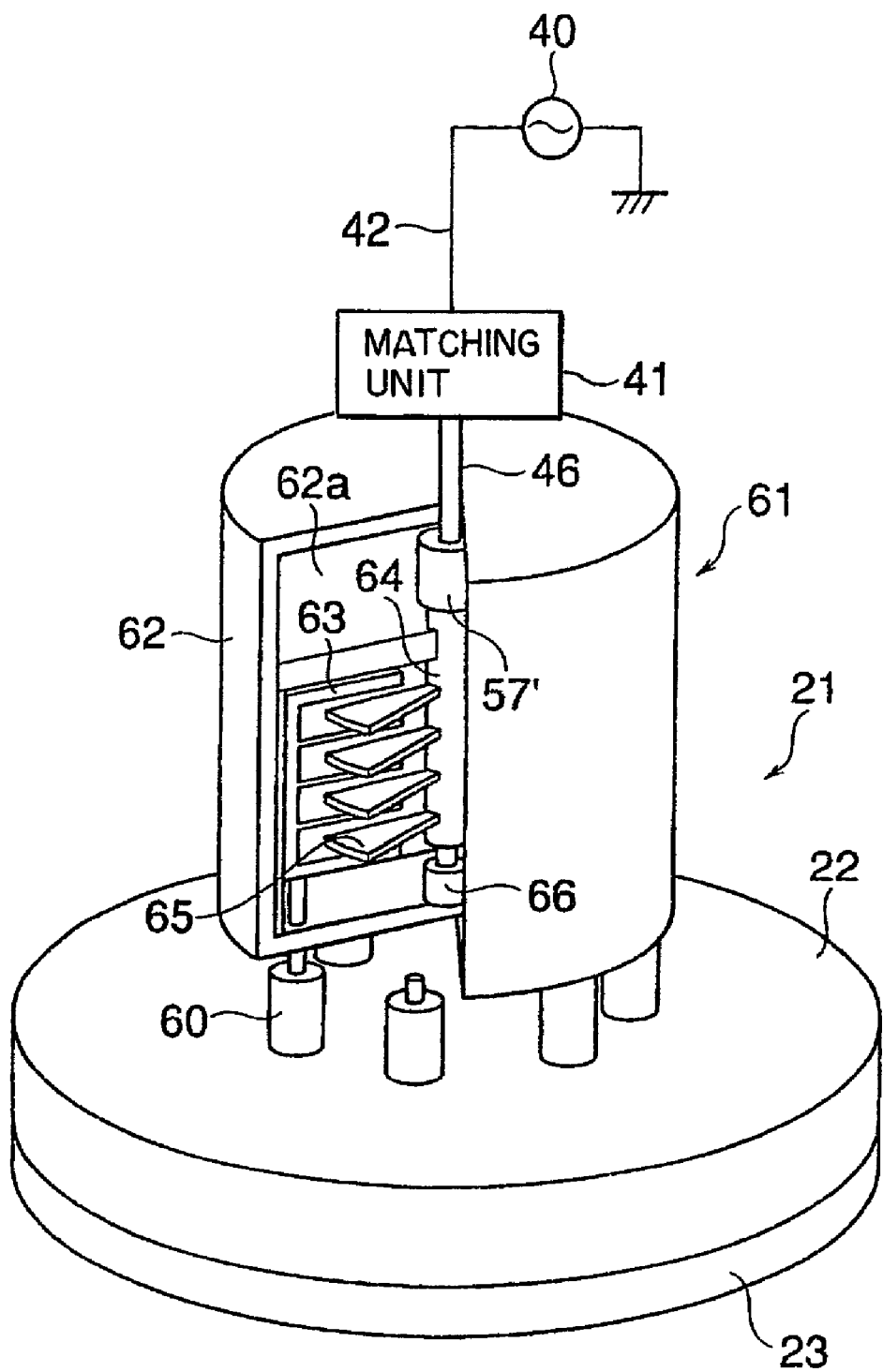
F I G. 8

PLASMA PROCESSING APPARATUS AND METHOD OF PLASMA PROCESSING

TECHNICAL FIELD

The present invention relates generally to a plasma processing system and method for plasma-processing a substrate, such as a semiconductor substrate.

BACKGROUND ART

For example, in a process for producing semiconductor devices, various plasma processes, such as etching, sputtering and CVD (chemical vapor deposition), are used for processing semiconductor wafers serving as substrates to be processed.

As plasma processing systems for carrying out such plasma processes, various systems are used. Among these systems, capacitive coupled parallel plate plasma processing systems are mainly used.

The capacitive coupled parallel plate plasma processing system has a pair of parallel plate electrodes (top and bottom electrodes) in a chamber. This system is designed to introduce a process gas into the chamber and to apply high-frequency electric power to one of the electrodes to form a high frequency electric field between the electrodes to form plasma of the process gas by the high frequency electric field to plasma-process semiconductor wafers.

For example, when a film, e.g., an oxide film, on a semiconductor wafer is etched by means of such a capacitive coupled parallel plate plasma processing system, the optimum radical control can be carried out by causing the pressure in the chamber to be a medium pressure to form a medium density plasma. Thus, it is possible to obtain an appropriate plasma state, so that it is possible to realize stable and repeatable etching with a high etching selectivity.

However, in recent years, the scale down of the design rule for ULSIS is increasingly advancing, and a higher aspect ratio of a hole shape is required, so that conventional conditions are not always sufficient in etching of an oxide film and so forth.

Therefore, it has been attempted to raise the frequency of the high frequency electric power to be applied, to form a high density plasma while maintaining the good dissociation state of plasma. Thus, it is possible to form an appropriate plasma under lower pressure conditions, so that it is possible to appropriately cope with the further scale down of the design rule.

By the way, according to the results of the inventor's study, it was revealed that there was the following new problem when the frequency of the high frequency electric power to be applied was raised to increase the density of plasma.

Conventionally, the feed to the top electrode is carried out via a feeder rod. This feeder rod is provided at the center on the reverse surface of the top electrode. If the applied frequency is raised to form a high density plasma, the high frequency plasma only flows through the surface portion of the electrode. Thus, the high frequency electric power supplied from the feeder rod to the top electrode passes through the reverse surface of the electrode to reach the circumferential direction of the electrode to be gradually supplied along the plasma contact surface of the electrode from the circumferential side toward the center. In addition, the circumferential portion of the top electrode is surrounded by an insulator (capacitance component), and the chamber outside of the insulator is safety-grounded. Therefore, standing waves are formed on the plasma contact surface of the top electrode due to the interference action, so that the electric field distribution is non-uniform in radial directions of the electrode.

If the electric field distribution is thus non-uniform, the density of plasma is non-uniform, and the etching rate distribution is non-uniform in etching, so that it is required to remove the cause of such non-uniformity of the electric field distribution to make the etching rate distribution uniform.

However, conventionally, such problems caused by using the high density plasma have not been always recognized, and it has not sufficiently attempted to remove the above described non-uniformity of the electric field distribution in the present circumstances.

DISCLOSURE OF THE INVENTION

The present invention has been made in view of such circumstances. It is an object of the present invention to provide a plasma processing system and method capable of decreasing the non-uniformity of an electric field distribution on the surface of an electrode and making the density of plasma uniform, in a plasma processing using a high density plasma capable of coping with a further scale down.

In order to accomplish the above described object, according to a first aspect of the present invention, there is provided a plasma processing system comprising: a chamber for housing therein a substrate to be processed; first and second electrodes which are provided in the chamber so as to face each other; a high frequency electric power supply for supplying a high frequency electric power to the first electrode via a matching unit; a feeding member for feeding the high frequency electric power from the high frequency electric power supply to the opposite surface to a surface of the first electrode facing the second electrode; a moving mechanism for moving the feeding position of the feeding member; evacuation means for maintaining the interior of the chamber in a predetermined reduced pressure state; and process gas feed means for feeding a process gas into the chamber, wherein the process gas is activated as plasma by the high frequency electric power to carry out a plasma processing.

According to a second aspect of the present invention, there is provided a plasma processing system comprising: a chamber for housing therein a substrate to be processed; first and second electrodes which are provided in the chamber so as to face each other; a high frequency electric power supply for supplying a high frequency electric power to the first electrode via a matching unit; feeding means for feeding the high frequency electric power from the high frequency electric power supply to the opposite surface to a surface of the first electrode facing the second electrode; evacuation means for maintaining the interior of the chamber in a predetermined reduced pressure state; and process gas feed means for feeding a process gas into the chamber, wherein the feeding means comprises: a feeder plate which is provided so as to be spaced from the opposite surface to the surface of the first electrode facing the second electrode; a feeding member for feeding the high frequency electric power from the high frequency electric power supply to the first electrode, the feeding member being connected to the feeder plate at a position which is radially shifted from a position corresponding to the center of the opposite surface to the surface of the first electrode facing the second electrode; and a rotating mechanism for rotating the feeder plate to rotate the feeding position of the feeding member on the feeding plane of the first electrode, wherein the process gas is activated as plasma by the high frequency electric power to carry out a plasma processing.

According to a third aspect of the present invention, there is provided a plasma processing system comprising: a chamber for housing therein a substrate to be processed; first and second electrodes which are provided in the chamber so as to face each other; a high frequency electric power supply for supplying a high frequency electric power to the first electrode via a matching unit; feeding means for feeding the high frequency electric power from the high frequency electric power supply to the opposite surface to a surface of the first electrode facing the second electrode; evacuation means for maintaining the interior of the chamber in a predetermined reduced pressure state; and process gas feed means for feeding a process gas into the chamber, wherein the feeding means comprises: a feeding portion which is connected to the high frequency electric power supply; a plurality of receiving terminal portions which are provided at positions other than the center on the surface of the first electrode facing the second electrode; and a switching mechanism, one end of which is connected to the feeding portion and which is movable so as to be capable of feeding to each of the plurality of receiving terminal portions, for sequentially switching a receiving terminal portion of the receiving terminal portions for receiving the high frequency electric power from the high frequency electric power supply, wherein the process gas is activated as plasma by the high frequency electric power to carry out a plasma processing.

According to a fourth aspect of the present invention, there is provided a plasma processing system comprising: a chamber for housing therein a substrate to be processed; first and second electrodes which are provided in the chamber so as to face each other; a high frequency electric power supply for supplying a high frequency electric power to the first electrode; feeding means for feeding the high frequency electric power from the high frequency electric power supply to the opposite surface to a surface of the first electrode facing the second electrode; evacuation means for maintaining the interior of the chamber in a predetermined reduced pressure state; and process gas feed means for feeding a process gas into the chamber, wherein the feeding means comprises: a plurality of receiving terminal portions which are provided at positions other than the center on the surface of the first electrode facing the second electrode; a plurality of feeding lines for connecting the high frequency electric power supply to the receiving terminal portions; and a switching mechanism for sequentially switching a receiving terminal portion of the receiving terminal portions for receiving the high frequency electric power from the high frequency electric power supply, wherein the process gas is activated as plasma by the high frequency electric power to carry out a plasma processing.

According to a fifth aspect of the present invention, there is provided a plasma processing method for arranging a substrate to be processed, in a processing space between first and second electrodes provided so as to face each other, to supply a high frequency electric power to the first electrode while feeding a process gas into the processing space, to form plasma in the processing space to plasma-process the substrate, wherein a feeding position is moved on a feeding plane when a high frequency electric power is fed to the opposite surface to a surface of the first electrode facing the second electrode to form plasma.

According to a sixth aspect of the present invention, there is provided a plasma processing method for arranging a substrate to be processed, in a processing space between first and second electrodes provided so as to face each other, to supply a high frequency electric power to the first electrode while feeding a process gas into the processing space, to form plasma in the processing space to plasma-process the substrate, wherein a plurality of receiving terminal portions are provided at positions other than the center on the opposite surface to the surface of the first electrode facing the second electrode, and a receiving terminal portion of the receiving terminal portions for receiving a high frequency electric power is sequentially switched when the high frequency electric power is fed to the first electrode to form plasma.

According to the present invention, a substrate to be processed is arranged in a processing space between first and second elements which are provided so as to face each other. By supplying a high frequency electric power to the first electrode while feeding a process gas to the processing space, plasma is formed in the processing space to plasma-process the substrate. When the high frequency electric power is fed to the opposite surface to a surface of the first electrode facing the second electrode to form plasma, the feeding position is moved on the feeding plane. Therefore, no interference is caused unlike a case where a high frequency electric power is fed from the center of the electrode, so that it is possible to prevent standing waves caused by the interference action from being formed. For example, by shifting and rotating the feeding position from the center of the electrode, a position at which the field intensity is high moves, so that the field intensity is equalized. Therefore, the field distribution on the plasma contact surface of the first electrode can be uniform, so that the density of plasma can be uniform.

BRIEF DESCRIPTION OF THE DRAWINGS

FIG. 1 is a sectional view of the first preferred embodiment of a plasma processing system according to the present invention;

FIG. 6 is a circuit diagram showing a matching unit for use in the first preferred embodiment of a plasma processing system according to the present invention;

FIG. 8 is a perspective view of the second preferred embodiment of a plasma processing system according to the present invention, wherein a part of the surrounding portion of a top electrode is cut away.

BEST MODE FOR CARRYING OUT THE INVENTION

Figure 2:
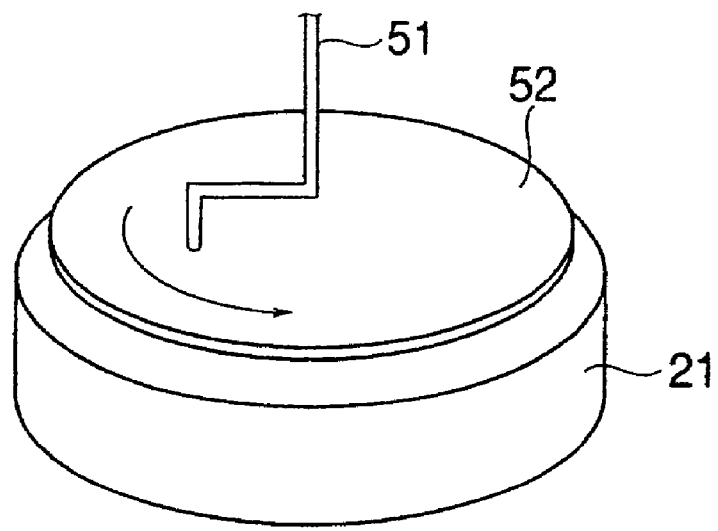
FIG. 2 is a perspective view for explaining a feeder mechanism to a top electrode in the first preferred embodiment of a plasma processing system according to the present invention.

Referring now to the accompanying drawings, the preferred embodiments of the present invention will be described below.

First, the first preferred embodiment of the present invention will be described. FIG. 1 is a sectional view schematically showing the first preferred embodiment of a plasma processing system according to the present invention. This plasma processing system 1 is a capacitive coupled parallel plate etching system wherein top and bottom electrode plates face each other in parallel to each other and wherein a plasma forming power supply is connected to one of the electrodes.

The plasma etching processing system 1 has a cylindrical chamber 2 of aluminum, the surface of which is anodized. This chamber 2 is safety-grounded. A substantially cylindrical susceptor supporting table 4 for mounting thereon an object to be processed, e.g., a semiconductor wafer (which will be hereinafter referred to as a "wafer") W, is provided on the bottom in the chamber 2 via an insulating plate 3 of a ceramic or the like. A susceptor 5 constituting a bottom electrode is provided on the susceptor supporting table 4. The susceptor 5 is connected to a high-pass filter (HPF) 6.

A chiller brine patch 7 is provided in the susceptor supporting table 4. A brine is fed into the chiller brine path 7 via a brine inlet pipe 8 to be discharged from a brine outlet pipe to be circulated. The cold of the brine is transferred to the wafer W via the susceptor 5, so that the temperature of the processed surface of the wafer W is controlled to be a desired temperature.

The upper-central portion of the susceptor 5 is formed so as to have a protruding disk shape. On the susceptor 5, an electrostatic chuck 11 having substantially the same shape of the wafer W is provided. The electrostatic chuck 11 has an electrode 12 provided between insulating materials, and is designed to electrostatically absorb the wafer W by Coulomb force when a dc voltage of 1.5 kV is applied thereto from a dc power supply 13 connected to the electrode 12.

The insulating plate 3, the susceptor supporting plate 4, the susceptor 5 and the electrostatic chuck 11 have a gas passage 14 for supplying helium gas serving as a heat transfer medium to the reverse surface of the wafer W serving as the object to be processed. The cold of the susceptor 5 is transferred to the wafer W via the heat transfer medium, so that the temperature of the wafer W is maintained to be a predetermined temperature.

On the top peripheral edge of the susceptor 5, an annular focus ring 15 is arranged so as to surround the wafer W mounted on the electrostatic chuck 11. The focus ring 15 is made of a conductive material, such as silicon. By the focus ring 15, the uniformity of etching is improved.

Above the susceptor 5, a top electrode 21 facing the susceptor 5 in parallel thereto is provided. The top electrode 21 is supported on the upper portion of the chamber 2 via an insulating material 25, and forms a surface facing the susceptor 5. The top electrode 21 comprises: an electrode plate 23 which has a large number of discharge holes 24 and which is made of, e.g., anodized aluminum, silicon, SiC or amorphous carbon; and a water-cooling electrode supporting body 22 of, e.g., anodized aluminum. Furthermore, the susceptor 5 is spaced from the top electrode 21 by about 10 to 60 mm.

The electrode supporting body 22 of the top electrode 21 has a gas inlet 26. The gas inlet 26 is connected to a gas supply pipe 27 which is connected to a process gas supply source 30 via a valve 28 and a mass flow controller 29. A process gas for a plasma processing, e.g., etching, is supplied from the process gas supply source 30.

As the process gases, various process gases having been conventionally used may be adopted, and halogen containing gases, such as fluorocarbon gas ($C_xF_y$) and hydrofluorocarbon gases ($C_pH_qF_r$) may be suitably used. In addition, a rare gas, such as Ar or He, or $N_2$ may be added.

The bottom of the chamber 2 is connected to an exhaust pipe 31 which is connected to an exhaust system 35. The exhaust system 35 is equipped with a vacuum pump, such as a turbo-molecular pump, by which the interior of the chamber 2 can be evacuated to a predetermined reduced pressure atmosphere, e.g., a predetermined pressure of 0.01 Pa or less. The side wall of the chamber 2 is provided with a gate valve 32. While the gate valve 32 is open, the wafer W is carried in and out of an adjacent load-lock chamber (not shown).

A high frequency electric power is designed to be supplied to the top electrode 21 from a first high frequency electric power supply 40, and a matching unit 41 is provided in a feeder line 42 of the first high frequency electric power supply 40. The top electrode 21 is connected to a low-pass filter (LPF) 43. The first high frequency electric power supply 40 has a frequency of 27 MHz or higher. By applying such a high frequency, it is possible to form a high density plasma in a desired dissociation state in the chamber 2, so that it is possible to carry out a plasma processing under low pressure conditions. In this embodiment, a high frequency electric power supply of 60 MHz is used as the high frequency electric power supply 40.

Above the chamber 2, an electromagnetic shielding box 50 having the same diameter as that of the chamber 2 is provided so as to be continuous from the chamber 2. In the electromagnetic shielding box 50, a feeder rod (feeder member) 51 and a feeder plate 52 are provided. Outside of the electromagnetic shielding box 50, a motor 53 for rotating the feeder plate 52 is provided. The feeder rod 51, the feeder plate 52 and the motor 53 constitute a feeder means.

Also as shown in FIG. 2, the feeder plate 52 is a disk shape, and is provided so as to be parallel to the reverse surface of the top electrode 21 to be spaced slightly from the top electrode 21 to be rotatable about the center of the top electrode 21. The feeder plate 52 has a smaller diameter than that of the top electrode 21, and is concentric with the top electrode 21.

Figure 3:
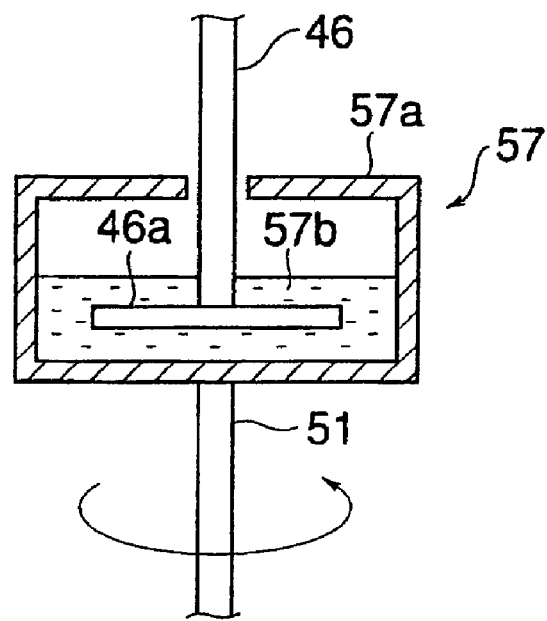
FIG. 3 is a sectional view showing a connection mechanism for connecting a top feeder rod to a feeder rod for use in the first preferred embodiment of a plasma processing system according to the present invention.

The feeder rod 51 has a crank shape having an upper vertical portion 51a which vertically extends from the ceiling wall of the electromagnetic shielding box 50 toward the center of the feeder plate 52, a horizontal portion 51b which outwardly and horizontally extends from the upper vertical portion 51a, and a lower vertical portion 51c which vertically extends from the horizontal portion 51b to be connected to a position shifted from the center of the feeder plate 52. Between the upper vertical portion 51a and the ceiling wall of the electromagnetic shielding box 50, a bearing 56 is provided, so that the feeder rod 51 is rotatable. Above the bearing 56, a connection mechanism 57 for connecting a fixed top feeder rod 46 serving as the output of the matching unit 41 to the rotatable feeder rod 51 is provided. As shown in FIG. 3, the connection mechanism 57 has a box 57a and mercury 57b stored therein. The tip portion of the top feeder rod 46 including a disk portion 46 provided on the tip of the top feeder rod 46 is immersed in the mercury 57b. When the feeder rod 51 rotates, the box 57a rotates.

The motor 53 is provided on the top of the electromagnetic shielding box 50. The rotation shaft 54 of the motor 53 extends vertically downwards into the electromagnetic shielding box 50, and a gear 55 is mounted on the bottom end of the rotation shaft 54. On the other hand, the peripheral surface of the feeder plate 52 has a gear so that the feeder plate 52 meshes with the gear 55. The feeder plate 52 is supported on a supporting mechanism (not shown). Therefore, the feeder plate 52 is rotatable about the feeder rod 51.

The distance between the feeder plate 52 and the top electrode 21 is, e.g., about 5 mm. The feeder plate 52 and the top electrode 21 are capacitive-coupled. If the feeder plate 52 rotates in this state as described above, a connection portion of the feeder rod 51 to the feeder plate 52 rotates about the feeder plate 52. Therefore, the feeding position to the top electrode 21 rotates about the center of the top electrode 21 on the reverse surface of the electrode 21, i.e., on the top surface of the electrode supporting body 22.

The susceptor 5 serving as the bottom electrode is connected to a second high frequency electric power supply 44, and a matching unit 45 is provided in the feeder line of the second high frequency electric power supply 44. The second high frequency electric power supply 44 has a frequency selected from, e.g., a range of 100 kHz to 13.56 MHz. By applying a frequency of such a range, an appropriate ion action can be applied to the wafer W serving as the object to be processed. In this embodiment, a high frequency electric power supply of 2 MHz is used as the second high frequency electric power supply 44.

A process using the plasma processing system 1 with the above described construction will be described below.

First, after the gate valve 32 is open, a wafer W serving as a substrate to be processed is carried in the chamber 2 from a load-lock chamber (not shown) to be mounted on the electrostatic chuck 11. Then, a dc voltage is applied from the high-voltage dc power supply 13, so that the wafer W is electrostatically absorbed onto the electrostatic chuck 11. Then, the gate valve 32 is closed, and the interior of the chamber 2 is evacuated to a predetermined degree of vacuum by means of the exhaust system 35.

Thereafter, the valve 28 is open, and a process gas is fed from the process gas supply source 30 into the top electrode 21 via the process gas supply pipe 27 and gas inlet 26 while the flow rate of the process gas is adjusted by the mass flow controller 29. Then, the process gas passes through the discharge holes 24 to be uniformly supplied to the wafer W as shown by arrows in FIG. 1, and the pressure in the chamber 24 is maintained at a predetermined value.

Thereafter, a high frequency of 60 MHz is applied to the top electrode 21 from the first high frequency electric power supply 40. Thus, a high frequency electric field is generated between the top electrode 21 and the susceptor 5 serving as the bottom electrode, and the process gas is dissociated to form plasma, with which the wafer W is etched.

On the other hand, a high frequency of 2 MHz is applied to the susceptor 5 serving as the bottom electrode from the second high frequency electric power supply 44. Thus, ions in plasma are accerelated toward the susceptor 5, so that the anisotropic of etching is enhanced by the ion assist.

Figure 4:
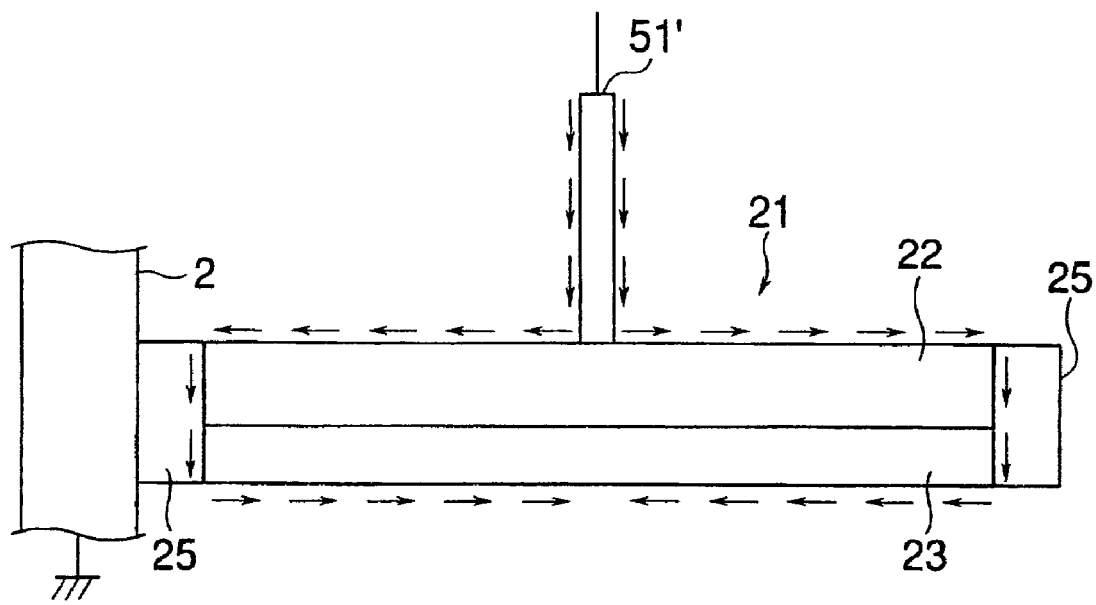
FIG. 4 is a sectional view schematically showing a supply path of a high frequency electric power in a conventional top electrode.
Figure 5:
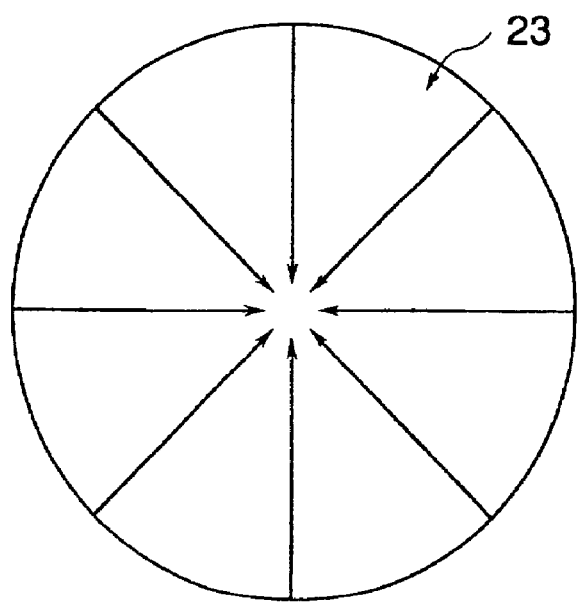
FIG. 5 is a bottom view schematically showing a supply path of a high frequency electric power in a conventional top electrode.

Referring to FIGS. 4 and 5, the problems in the prior art caused in such a case will be described below. As described above, if the frequency of the high frequency applied to the top electrode 21 is higher than 27 MHz, the density of plasma can be increased. However, in the conventional system wherein the feeder rod is arranged at the center of the electrode, the interference based on the phase differences of current and voltage forms standing waves on the plasma contact surface of the top electrode 21, so that the electric field is non-uniform.

That is, the electrode plate 23 of the top electrode 21 is usually made of a conductive material, such as anodized aluminum, Si or SiC, or a semiconductor. If the frequency of a high frequency current supplied from the high frequency electric power supply 40 via the feeder rod 51' is increased, power is supplied only to the surface of the electrode by the skin effect (the surface depth δ at this time is expressed by $(2/\omega\sigma\mu)^{1/2}$ wherein $\omega=2\pi f$ (f: frequency), σ is conductivity and μ is permeability). If the feeder rod exists at the center of the top electrode 21, voltage and current pass through the surface of the feeder rod 51', the top face of the electrode supporting body 22, the side of the electrode supporting body 22 and the side of the electrode plate 23 to reach the bottom surface of the electrode plate 23 serving as the plasma contact surface. In this case, since the feeder rod 51' exists at the center of the top electrode 21, voltage and current have the same phase anywhere in the edge portion of the bottom surface of the electrode plate 23, and power is gradually supplied at the same phase from the edge portion of the electrode plate 23 toward the center as shown in FIG. 5. For that reason, a phase difference d/λ (λ is the wavelength of electrode surface waves, and d is the radius of the electrode) is cased between the center and edge portion of the electrode plate 23. In an electrical equivalent circuit, the circumferential portion of the top electrode 21 is grounded via an insulator (C component) in directions in which power is supplied to plasma. Thus, the field intensity $E_0$ at the circumferential position is $E_0 = E \cdot \cos(\omega t)$, and the field intensity E0 at the central portion of the electrode is $E_0 = E \cdot \cos(\omega t + d/\lambda)$, wherein ω is an applied frequency and λ is a (frequency shortened) frequency formed from the applied frequency and higher harmonics via plasma. At this time, the high frequency electric power is gradually supplied from the circumferential portion toward the center, so that voltage and current from the circumferential side converge at the central portion. Thus, the field intensity at the central portion on the bottom surface of the electrode plate 23 is higher than the field intensity at the edge portion thereof. Since the center contacts plasma, it is an open end as an RF equivalent circuit. Therefore, standing waves having a wavelength of λ=2d in radial directions are formed on the bottom surface of the electrode plate 23. For that reason, the density of plasma is uneven.

Therefore, in this preferred embodiment, in order to remove the standing waves generated by such a case, the disk-shaped feeder plate is arranged in parallel to the reverse surface of the top electrode 21 to be slightly spaced from the top electrode 21 to be rotatable about the center thereof, and the feeder rod 51 is connected to the feeder plate 52 at the position shifted from the center thereof. Since the feeder plate 52 and the top electrode 21 are capacitive-coupled, the connection portion 58 of the feeder rod 51 to the feeder plate 52 rotates about the center of the feeder plate 52 by rotating the feeder plate 52 in this state. Since the high frequency current flows from the capacitive-coupled feeder plate 52 to the top electrode 21, the feeding position to the top electrode 21 rotates about the center of the top electrode 21 on the top face of the electrode supporting body 22.

Since the feeding position thus moves in the feeding plane of the top electrode 21, it is possible to prevent standing waves from being formed by the interference unlike a case where a high frequency electric power is fed from the center of the top electrode 21. That is, the position having a high field intensity is shifted from the center by shifting the feeding position from the center of the top electrode 21, and the position having the high field intensity moves by rotating the feeding position, so that the field intensity is equalized. Therefore, the field distribution on the plasma contact surface of the top electrode 21 can be more uniform, so that the density of plasma can be uniform.

In this case, the quantity of the feeding position shifted from the center of the top electrode 21 should not be particularly limited, the feeding position is preferably shifted by a radius of the half-value width of standing waves formed when a high frequency electric power is fed from the center of the top electrode 21.

The rotating speed of the feeding position, i.e., the rotating speed of the feeder plate 52, is preferably as high as possible, in order to avoid charge-up damage which may be caused by the non-uniformity of plasma when a film to be etched is an insulating film, and in order to make the uniformity of etching good. However, the rotating speed may be 20 rpm or higher in view of only the uniformity of etching.

Furthermore, the matching unit 41 has a structure shown in FIG. 6 wherein a inductor 871 and a variable capacitor 84 are provided from the upstream side in series to the high frequency electric power supply 40 and the feeder rod 51, a grounded capacitor 80 is connected to the upstream of the inductor 81, and a grounded variable capacitor 82 and a grounded capacitor 83 are connected to the downstream of the inductor 81. The top electrode 21 and the feeder plate 51 form a capacitor. If its electrostatic capacity is not greater than the electrostatic capacity of the variable capacitor 84 formed in series to the feeder rod 51 of the matching unit 41, there is the possibility that the matching range may vary. Therefore, the electrostatic capacitance of the capacitor formed by the top electrode 21 and the feeder plate 52 is preferably greater than the electrostatic capacitance of the variable capacitance 84 in view of the prevention of the variation in matching range, more preferably ten times or more as large as the electrostatic capacitance of the variable capacitor 84.

In addition, since the connection mechanism 57 for connecting the fixed top feeder rod 46 to the rotatable feeder rod 51 connects them by means of mercury, the structure of the connection mechanism 57 can be simple, and it is possible to decrease electrical resistance and prevent friction from being produced.

Figure 7:
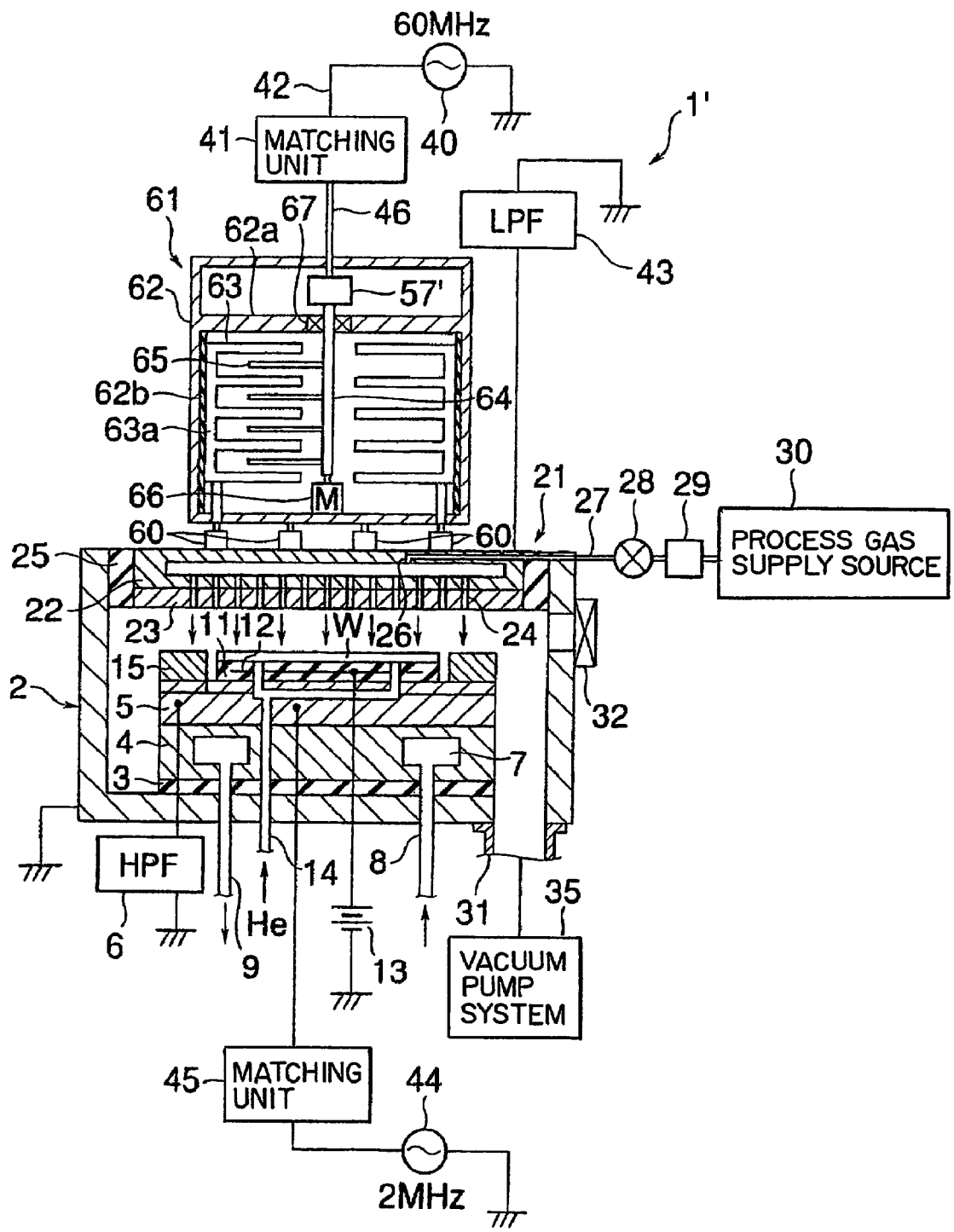
FIG. 7 is a sectional view showing the second preferred embodiment of a plasma processing system according to the present invention.

The second preferred embodiment of the present invention will be described below. FIG. 7 is a sectional view schematically showing the second preferred embodiment of a plasma processing system according to the present invention, and FIG. 8 is a perspective view schematically showing the plasma processing system of FIG. 7 wherein a part of the surrounding portion of a top electrode is cut away. Similar to the first preferred embodiment, this plasma processing system 1' is also a capacitively coupled parallel plate etching system wherein top and bottom electrode plates face each other in parallel to each other and wherein a plasma forming power supply is connected to one of the electrodes. In FIG. 7, the same reference numbers are basically given to the same elements as those in FIG. 1, and the descriptions thereof will be omitted.

In this preferred embodiment unlike the first preferred embodiment, the system has a plurality of (6 in the shown embodiment) receiving terminal portions 60 which are arranged on the reverse surface of a top electrode 21, i.e., the top face of an electrode supporting body 22, at regular intervals on circumferences concentrically with the top electrode 21, and a switching mechanism 61, one end of which is connected to a top feeder rod 46 so as to be capable of feeding to each of the plurality of receiving terminal portions 60 and which sequentially switch the receiving terminal portions 60 by which a high frequency electric power is received from a high frequency electric power supply 40.

The switching mechanism 61 is provided at the center on the top face of the electrode supporting body 22, and has a housing 62, receiving terminal plates 63 which are provided in the housing 62 and each five of which are connected to each of the receiving terminal portions 60, a rotating member 64 which is rotatably provided so as to extend vertically at the center of the housing 62, four sector feeding terminal plates 65 which are mounted on the rotating member 64 and which extend in the same direction, and a motor 66 which is provided on the bottom in the housing 62 for rotating the rotating member 64. The outside portions of the five receiving terminal plates 63 of each of the receiving terminals are connected to each other by means of a member 63a, and an insulating member 62b is provided between the peripheral wall of the housing 62 and the member 63a. A disk-shaped supporting wall 62a is provided in the housing 62, and a bearing 67 is mounted between the supporting wall 62a and the rotating member 64. A connection mechanism 57' is also provided for connecting the top feeder rod 46 to the rotating member 64. Similar to the connection mechanism 57 in the first preferred embodiment, the connection mechanism 57' is connected via mercury. The space between the top wall of the housing 62 and the fixed top feeder rod 46 is sealed, so that the housing 62 can be maintained in a vacuum state by means of an evacuation means (not shown).

The five receiving terminal plates 63 connected to each of the receiving terminal portions 60 are horizontally arranged, and the four feeding terminal plates 65 are also horizontally arranged. Each of the four feeding terminal plates 65 can pass through a space between adjacent two of the five receiving terminal plates 63. By vertically arranging each of the four feeding terminal plates 65 between adjacent two of the five receiving terminal plates 63 connected to each of the receiving terminal portions 60 as shown in the figure, the receiving terminal plates 63 and the feeding terminal plates 65 are capacitive-coupled. In this state, the high frequency electric power from the high frequency electric power supply 40 is supplied from the rotating member 64 to the top electrode 21 via a corresponding one of the receiving terminal portions 60. By rotating the rotating member 64, the receiving terminal portion 60 for receiving the power is sequentially switched. Other constructions are basically the same as those in FIG. 1.

In the plasma processing system 1' with such a construction, the same etching process as that in the first preferred embodiment of a plasma processing system according to the present invention is basically carried out.

In this preferred embodiment, the plurality of receiving terminal portions 60 are provided on the reverse surface of the top electrode 21, i.e., the top face of the electrode supporting body 22, and the receiving terminal plates 63 connected to the respective receiving terminal portions 60 can be capacitive-coupled with the feeding terminal plates 65 connected to the rotating member 64. In addition, the feeding terminal plates 65 pass above and below the receiving terminal plates 63 by rotating the rotating member 64, so that such a capacitive coupling is sequentially formed in each of the receiving terminal portions 60. Thus, the receiving terminal portions 60 forming a capacitive coupling (capacitor) sequentially receive the high frequency electric power from the high frequency electric power supply 40.

Therefore, the feeding position to the top electrode 21 moves in accordance with the rotation of the rotating member 64, so that no fixed interference fringes are produced unlike a case where a high frequency electric power is fed from the center of the top electrode 21. Thus, it is possible to prevent standing waves caused by the interference from being formed. Specifically, the feeding position to the top electrode 21 is set to be any one of the receiving terminal portions 60, which is shifted from the center of the top electrode 21, so that the position having the high field intensity is shifted from the center of the top electrode 21, and a receiving one of the receiving terminal portions 60 arranged on the circumferences concentrically with the top electrode 21 is sequentially switched to rotate the feeding position to the top electrode 21 to move the position having the high field intensity, so that the field intensity is equalized. Therefore, the field distribution on the plasma contact surface of the top electrode 21 can be uniform, so that the density of plasma can be uniform.

At this time, the interior of the housing 62 of the switching mechanism 61 is in a predetermined vacuum state by means of an exhaust mechanism (not shown), so that atmosphere breakdown is difficult to occur. Therefore, the spaces between the receiving terminal plates 63 and the feeding terminal plates 65 can be narrow, so that the electrostatic capacity of the formed capacitors can be increased to decrease the loss of the high frequency electric power. In addition, by providing the plurality of receiving terminal plates 63 for each of the receiving terminal portions 60 to arrange the plurality of feeding terminal plates 65 therebetween, the area of the electrode of the capacitor increases to increase the electrostatic capacity, so that it is possible to decrease the loss of the high frequency electric power. Of course, one receiving terminal plate 63 may be provided for each of the receiving terminal portions 60, and one feeding terminal plate 65 may be provided to form one capacitor. In particular, when the interior of the housing 62 of the switching mechanism 61 is in a vacuum state as this preferred embodiment, the spaces between the receiving terminal plates 63 and the feeding terminal plates 65 can be narrow. Therefore, even if one receiving terminal plate 63 is provided for each of the receiving terminal portions 60 and even if one feeding terminal plate 65 is provided to form one capacitor, it is possible to obtain a great electrostatic capacity. Furthermore, also in the first preferred embodiment shown in FIG. 1, the same effect can be obtained if the space including the feeder plate 52 and so forth is evacuated.

The moving speed of the feeding position, i.e., the switching period of the receiving terminal portion 60, is preferably as high as possible, in order to avoid charge-up damage which may be caused by the non-uniformity of plasma when a film to be etched is an insulating film, and in order to make the uniformity of etching good. However, the period may be 20/min or more in view of only the uniformity of etching.

Furthermore, in this preferred embodiment, the receiving terminal plate 63 and the feeding terminal plate 65 form a capacitor, and if its electrostatic capacitance is not greater than the electrostatic capacitance of the variable capacitor 84 formed in series to the feeder rod 51 of the matching unit 41, there is the possibility that the matching range may vary. Therefore, the electrostatic capacitance of the capacitor formed by the receiving terminal plate 63 and the feeding terminal plate 65 is preferably greater than the electrostatic capacitance of the variable capacitor 84 in view of the prevention of the variation in matching range, more preferably ten times or more as large as the electrostatic capacitance of the variable capacitor 84.

Figure 9:
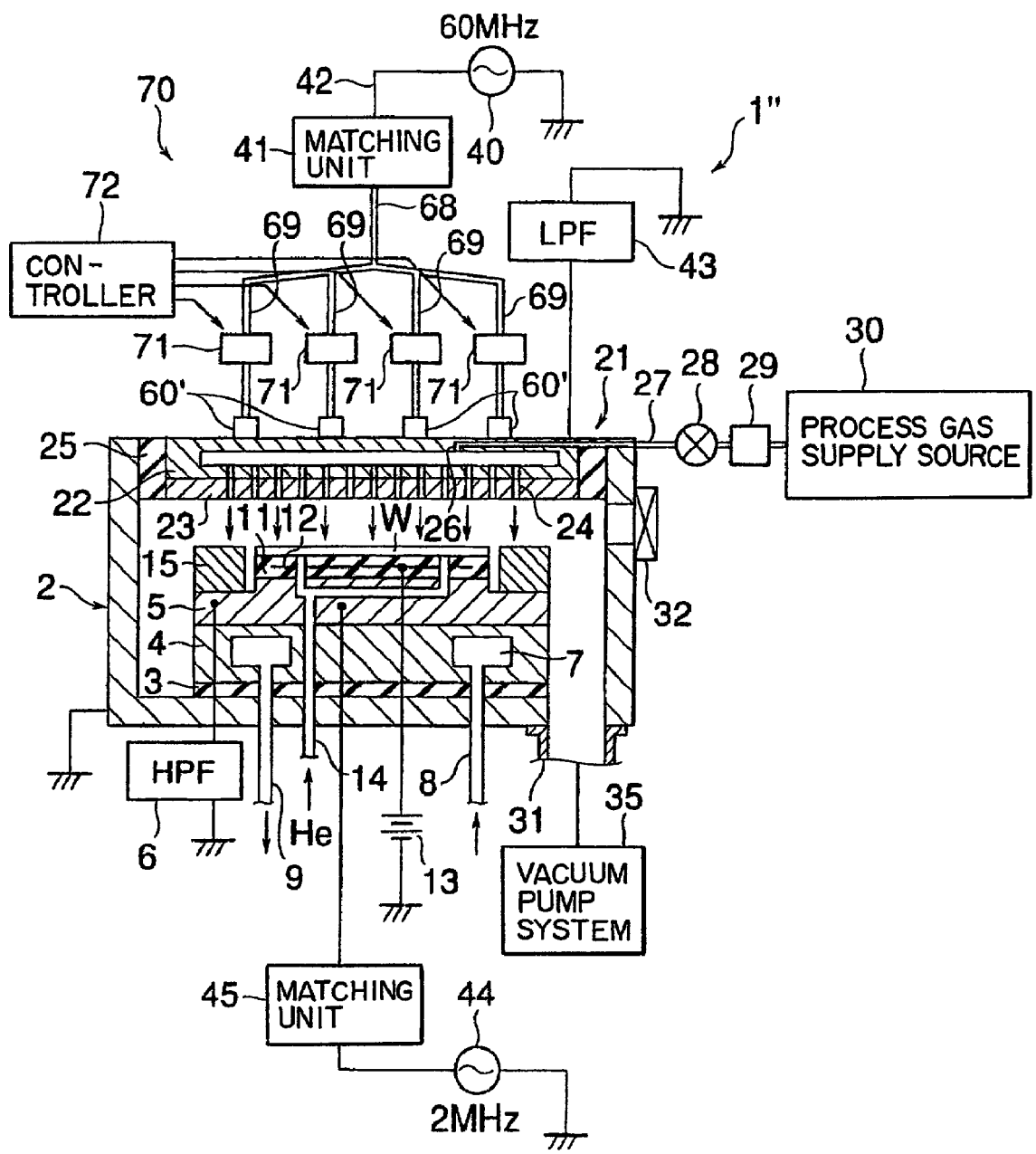
FIG. 9 is a sectional view showing the third preferred embodiment of a plasma processing system according to the present invention.

The third preferred embodiment of the present invention will be described below. FIG. 9 is a sectional view schematically showing the third preferred embodiment of a plasma processing system according to the present invention. Similar to the preceding preferred embodiments, this plasma processing system 1″ is also a capacitive coupled parallel plate etching system wherein top and bottom electrode plates face each other in parallel to each other and wherein a plasma forming power supply is connected to one of the electrodes. In FIG. 9, the same reference numbers are basically given to the same elements as those in FIG. 1, and the descriptions thereof will be omitted.

In this preferred embodiment, similar to the receiving terminal portion 60 in the second preferred embodiment, the system has a plurality of receiving terminal portions 60′ which are arranged on the reverse surface of a top electrode 21, i.e., the top face of an electrode supporting body 22, at regular intervals on circumferences concentrically with the top electrode 21. The system is also provided with a feeder rod 68 connected to a matching unit 41, a feeder member 69 branching from the feeder rod 68 to be connected to each of the receiving terminal portions 60′, a switching element 71 of a PIN diode provided in each of the feeder members 69, and a switching mechanism 70 having a controller 72 for controlling the switching elements 71.

In the switching mechanism 70, the switching elements 71 can be turned on and off by a signal from the controller 72, and each of the switching elements 71 can be sequentially turned on when a predetermined pulse signal is outputted from the controller 72 to a corresponding one of the switching elements 71. Other constructions are basically the same as those in FIG. 1.

In the plasma processing system 1″ with such a construction, the same etching process as that in the first preferred embodiment of a plasma processing system 1 according to the present invention is basically carried out.

In this preferred embodiment, the plurality of receiving terminal portions 60′ are provided on the reverse surface of the top electrode 21, i.e., the top face of the electrode supporting body 22, and each of the feeder members 69 branching from the feeder rod 68 connected to each of the receiving terminal portions 60′ is provided with the switching element 71 of the PIN diode. Thus, the switching elements 71 which are turned on by the controller 72 are sequentially switched. In response thereto, each of the receiving terminal portions 60′ sequentially receives a high frequency electric power from the high frequency electric power supply 40. Therefore, the feeding position to the top electrode 21 moves in accordance with the on-off control action of the switching element 71 in response to the signal from the controller 72, so that no interference occurs unlike a case where a high frequency electric power is fed from the center of the top electrode 21. Thus, it is possible to prevent standing waves caused by the interference action from being formed. Specifically, the feeding position to the top electrode 21 is set to be the receiving terminal portions 60′, which is shifted from the center of the top electrode 21, so that the position having the high field intensity is shifted from the center of the top electrode 21, and a receiving one of the receiving terminal portions 60′ arranged on the circumferences concentrically with the top electrode 21 is sequentially switched to rotate the feeding position to the top electrode 21 to move the position having the high field intensity, so that the field intensity is equalized. Therefore, the field distribution on the plasma contact surface of the top electrode 21 can be uniform, so that the density of plasma can be uniform.

In this case, similar to the second preferred embodiment, the moving speed of the feeding position, i.e., the switching period of the receiving terminal portion 60', may be 20/min or more in view of only the uniformity of etching. However, in order to avoid charge-up damage which may be caused by the non-uniformity of plasma when a film to be etched is an insulating film, the period is preferably as high as possible. Specifically, it is considered that there is no possibility that charge-up damage may be caused if the period is 500 kHz or higher. In the first and second preferred embodiments, the movement of the feeding position is realized by the mechanical mechanism. Therefore, it is substantially impossible to move the feeding position at such a high speed, so that it is not possible to completely prevent the occurrence of charge-up damage. In this preferred embodiment, since the switching element is switched by electrical signals from the controller 72, it is possible to realize the movement of the feeding position at such a high speed, so that it is possible to substantially completely charge-up damage.

In the above described first through third preferred embodiments, standing waves are more easily formed as the frequency applied to the top electrode increases. Therefore, these preferred embodiments are particularly effective when the applied frequency is 27 MHz or higher. However, even if the frequency is less than 27 MHz, the influence of standing waves exists, so that predetermined effects can be obtained by applying the present invention. In addition, when the density of plasma is $1 \times 10^{11}/cm^3$ or more, the above described problem is easily caused. The present invention is particularly effective in such a case.

Furthermore, the present invention should not be limited to the above described preferred embodiments, and the invention may be modified in various ways. For example, while the feeding position has moved along the circumferences of predetermined radii concentrically with the top electrode on the feeder plane in the above described first preferred embodiment, the present invention should not be limited thereto. The feeding position may move along circumferences which do not pass through the center of the top electrode. The moving locus of the feeding position should not be limited to the circumference, but it may be another shape. While the connection using mercury has been used as the connection mechanism for connecting the fixed part to the moving part, the present invention should not be limited thereto, but another mechanism such as a mechanical mechanism may be used.

While the receiving terminal portions have been arranged at regular intervals on the circumferences having predetermined radii concentrically with the top electrode on the feeder plane of the top electrode, they must not always be arranged on the circumferences concentrically with the top electrode, and they must not always be arranged at regular intervals. Moreover, if the receiving one of the receiving terminal portions can be sequentially switched, the arrangement of them must not always be circumferentially arranged. While the six receiving terminal portions have been provided, the number thereof should not be limited thereto. However, the number of the receiving terminal portions is preferably three or more. In order to promote the uniformity of plasma, the number of the receiving terminal portions is preferably larger.

While the electrostatic coupling has been utilized as the switching mechanism in the second preferred embodiment, the present invention should not be limited thereto if the switching mechanism has a variable part to sequentially allow feeding to the plurality of receiving terminal portions. While the PIN diode has been used as the switching element in the third preferred embodiment, the present invention should not be limited thereto if an element having a switching function is used. Moreover, means for moving the feeding position should not be limited to any one of those in the first through third preferred embodiments, but any means capable of moving the feeding position may be used.

While the high frequency electric power has been supplied to the top and bottom electrodes in any one of the above described preferred embodiments, the high frequency electric power may be supplied to only one of the electrodes. While the present invention has been applied to the top electrode, the invention may be applied to the bottom electrode. While the semiconductor wafer has been used as the substrate to be processed and while the wafer has been etched, the present invention should not be limited thereto. Other substrates such as liquid crystal display (LCD) substrates may be used as objects to be processed, and the plasma processing should not be limited to etching, but it may be another processing such as sputtering or CVD.

As described above, according to the present invention, the substrate to be processed is arranged in the processing space between the first and second electrodes which are provided so as to face each other, and plasma is formed in the processing space to plasma-process the substrate by supplying the high frequency electric power to the first electrode while feeding the process gas into the processing space. When the high frequency electric power is fed to the opposite surface to the surface of the first electrode facing the second electrode to form plasma, the feeding position is moved in the feeding plane. Therefore, no interference occurs unlike the case where a high frequency electric power is fed from the center of the electrode, so that it is possible to prevent standing waves caused by the interference action from being formed. Therefore, the field distribution on the plasma contact plane of the first electrode can be more uniform, so that the density of plasma can be uniform. For that reason, it is possible to uniformly carry out the plasma processing, so that it is possible to inhibit charge-up damage from occurring.

The invention claimed is:
1. A plasma processing system comprising:
a chamber for housing therein a substrate to be processed;
first and second electrodes provided in said chamber so as to face each other, said first electrode having a first surface, and a second surface that is opposite to said first surface and that faces said second electrode;
a high frequency electric power supply for supplying a high frequency electric power to said first electrode via a matching unit;
a feeding member for feeding said high frequency electric power from said high frequency electric power supply through a feeding position to said first surface of said first electrode, the feeding position being a single position with respect to the first surface;
a moving mechanism for moving the feeding position of said feeding member;
evacuation means for maintaining the interior of said chamber in a predetermined reduced pressure state; and
process gas feed means for feeding a process gas into said chamber,
wherein said process gas is activated as plasma by said high frequency electric power to carry out a plasma processing; and
wherein said moving mechanism substantially moves the feeding position of said feeding member on a circum- ference of a predetermined radius, which is concentric with said first electrode, on the first surface of said first electrode.

2. A plasma processing system according to claim 1, wherein said feeding member comprises:
- a feeder plate which is provided so as to be spaced from the opposite surface to the surface of said first electrode facing said second electrode;
- a feeding member for feeding said high frequency electric power from said high frequency electric power supply to said first electrode, said feeding member being connected to said feeder plate at a position which is radially shifted from a position corresponding to the center of the opposite surface to the surface of said first electrode facing said second electrode; and
- a rotating mechanism for rotating said feeder plate to rotate the feeding position of said feeding member on the feeding plane of said first electrode,
- wherein said process gas is activated as plasma by said high frequency electric power to carry out a plasma processing.

3. A plasma processing system as set forth in claim 1, wherein said feeding position moves on a circumference of a predetermined radius, which is concentric with said first electrode, on the opposite surface to the surface of said first electrode facing said second electrode.

4. A plasma processing system as set forth in claim 1, wherein said feeding position rotates at a rotational frequency of 20 rpm or more.

5. A plasma processing system as set forth in claim 1, wherein said high frequency electric power supply is connected to said feeding member via mercury.

6. A plasma processing system as set forth in claim 1, wherein the electrostatic capacitance of an electrostatic coupling formed by said first electrode and said feeder plate is greater than the electrostatic capacitance which is formed in said matching unit in series to said feeding member.

7. A plasma processing system according to claim 1, wherein said feeding member comprises:
- a plurality of receiving terminal portions which are provided at positions other than the center on the surface of said first electrode facing said second electrode;
- a plurality of feeding lines for connecting said high frequency electric power supply to said receiving terminal portions; and
- a switching mechanism for sequentially switching a receiving terminal portion of said receiving terminal portions for receiving said high frequency electric power from said high frequency electric power supply,
- wherein said process gas is activated as plasma by said high frequency electric power to carry out a plasma processing.

8. A plasma processing system as set forth in claim 7, wherein said switching mechanism comprises:
- a plurality of switching elements, each of which is provided in a corresponding one of said plurality of feeding lines; and
- control means for causing said switching elements to be sequentially turned on.

9. A plasma processing system as set forth in claim 8, wherein each of said switching elements has a PIN diode.

10. A plasma processing system as set forth in claim 7, wherein said plurality of receiving terminal portions are arranged on circumferences which do not pass through the center on the opposite surface to the surface of said first electrode facing said second electrode.

11. A plasma processing system as set forth in claim 10, wherein said plurality of receiving terminal portions are arranged at regular intervals on circumferences of predetermined radii, which are concentric with said first electrode, on the opposite surface to the surface of said first electrode facing said second electrode.

12. A plasma processing system as set forth in claim 10, wherein a cycle for sequentially switching the feeding terminal portions arranged on said circumstances is 20/min or more.

13. A plasma processing system as set forth in claim 7, wherein the number of said receiving terminal portions is at least three.

14. A plasma processing system as set forth in claim 7, wherein the number of said receiving terminal portions is at least three.

15. A plasma processing system comprising:
- a chamber for housing therein a substrate to be processed;
- first and second electrodes which are provided in said chamber so as to face each other;
- a high frequency electric power supply for supplying a high frequency electric power to said first electrode via a matching unit;
- feeding means for feeding said high frequency electric power from said high frequency electric power supply to the opposite surface to a surface of said first electrode facing said second electrode;
- evacuation means for maintaining the interior of said chamber in a predetermined reduced pressure state; and
- process gas feed means for feeding a process gas into said chamber,
- wherein said feeding means comprises:
- a feeder plate which is provided so as to be spaced from the opposite surface to the surface of said first electrode facing said second electrode;
- a feeding member for feeding said high frequency electric power from said high frequency electric power supply to said first electrode, said feeding member being connected to said feeder plate at a position which is radially shifted from a position corresponding to the center of the opposite surface to the surface of said first electrode facing said second electrode; and
- a rotating mechanism for rotating said feeder plate to rotate the feeding position of said feeding member on the feeding plane of said first electrode,
- wherein said process gas is activated as plasma by said high frequency electric power to carry out a plasma processing.

16. A plasma processing system as set forth in claim 15, wherein said feeding position moves on a circumference of a predetermined radius, which is concentric with said first electrode, on the opposite surface to the surface of said first electrode facing said second electrode.

17. A plasma processing system as set forth in claim 15, wherein said feeding position rotates at a rotational frequency of 20 rpm or more.

18. A plasma processing system as set forth in claim 15, wherein said high frequency electric power supply is connected to said feeding member via mercury.

19. A plasma processing system as set forth in claim 15, wherein the electrostatic capacitance of an electrostatic coupling formed by said first electrode and said feeder plate is greater than the electrostatic capacitance which is formed in said matching unit in series to said feeding member.

20. A plasma processing system comprising:
a chamber for housing therein a substrate to be processed;
first and second electrodes which are provided in said chamber so as to face each other;
a high frequency electric power supply for supplying a high frequency electric power to said first electrode via a matching unit;
feeding means for feeding said high frequency electric power from said high frequency electric power supply to the opposite surface to a surface of said first electrode facing said second electrode;
evacuation means for maintaining the interior of said chamber in a predetermined reduced pressure state; and
process gas feed means for feeding a process gas into said chamber,
wherein said feeding means comprises:
a feeding portion which is connected to said high frequency electric power supply;
a plurality of receiving terminal portions which are provided at positions other than the center on the surface of said first electrode facing said second electrode; and
a switching mechanism, one end of which is connected to said feeding portion and which is movable so as to be capable of feeding to each of said plurality of receiving terminal portions, for sequentially switching a receiving terminal portion of said receiving terminal portions for receiving said high frequency electric power from said high frequency electric power supply,
wherein said process gas is activated as plasma by said high frequency electric power to carry out a plasma processing.

21. A plasma processing system as set forth in claim 20, wherein said switching mechanism comprises:
a plurality of receiving terminal plates which are connected to said plurality of receiving terminal portions, respectively;
a plurality of feeding terminal plates which are connected to said feeding portion and each of which is capable of passing directly above or below a corresponding one of said receiving terminal plates of said receiving terminal portions, each of said feeding terminal plates being capable of being electrostatic-coupled with a corresponding one of said receiving terminal plates when facing said corresponding one of said receiving terminal plates; and
a driving mechanism for moving said feeding terminal plates to sequentially position said feeding terminal plates directly above or below each of said receiving terminal plates of said receiving terminal portions.

22. A plasma processing system as set forth in claim 21, wherein said feeding terminal plates are mounted on said switching mechanism, and said switching mechanism has a rotating member which is rotated by said driving mechanism, and wherein a high frequency electric power is fed to said feeding terminal plates via said rotating member.

23. A plasma processing system as set forth in claim 21, which further comprises pressure reducing means for causing said switching mechanism to exist in a pressure reduced atmosphere.

24. A plasma processing system as set forth in claim 21, wherein said plurality of receiving terminal plates connected to each of said receiving terminal portions are provided for each of said receiving terminal portions, and have a plurality of feeding terminal plates so as to be electrostatic-coupled with said plurality of receiving terminal plates of each of said receiving terminal portions.

25. A plasma processing system as set forth in claim 20, wherein said feeding portion is connected to said switching mechanism via mercury.

26. A plasma processing system as set forth in claim 21, wherein the electrostatic capacity of an electrostatic coupling formed by each of said receiving terminal plates and a corresponding one of said feeding terminal plates is greater than the electrostatic capacity formed in said matching unit in series to said feeding member.

27. A plasma processing system as set forth in claim 20, wherein the number of said receiving terminal portions is at least three.

28. A plasma processing system comprising:
a chamber for housing therein a substrate to be processed;
first and second electrodes which are provided in said chamber so as to face each other;
a high frequency electric power supply for supplying a high frequency electric power to said first electrode;
feeding means for feeding said high frequency electric power from said high frequency electric power supply to the opposite surface to a surface of said first electrode facing said second electrode;
evacuation means for maintaining the interior of said chamber in a predetermined reduced pressure state; and
process gas feed means for feeding a process gas into said chamber,
wherein said feeding means comprises:
a plurality of receiving terminal portions which are provided at positions other than the center on the surface of said first electrode facing said second electrode;
a plurality of feeding lines for connecting said high frequency electric power supply to said receiving terminal portions; and
a switching mechanism for sequentially switching a receiving terminal portion of said receiving terminal portions for receiving said high frequency electric power from said high frequency electric power supply,
wherein said process gas is activated as plasma by said high frequency electric power to carry out a plasma processing.

29. A plasma processing system as set forth in claim 28, wherein said switching mechanism comprises:
a plurality of switching elements, each of which is provided in a corresponding one of said plurality of feeding lines; and
control means for causing said switching elements to be sequentially turned on.

30. A plasma processing system as set forth in claim 29, wherein each of said switching elements has a PIN diode.

31. A plasma processing system as set forth in any one of claims 28 through 30, wherein said plurality of receiving terminal portions are arranged on circumferences which do not pass through the center on the opposite surface to the surface of said first electrode facing said second electrode.

32. A plasma processing system as set forth in claim 31, wherein said plurality of receiving terminal portions are arranged at regular intervals on circumferences of predetermined radii, which are concentric with said first electrode, on the opposite surface to the surface of said first electrode facing said second electrode.

33. A plasma processing system as set forth in claim 31, wherein a cycle for sequentially switching the feeding terminal portions arranged on said circumstances is 20/min or more.

34. A plasma processing system as set forth in claim 28, wherein the number of said receiving terminal portions is at least three.

35. A plasma processing method for arranging a substrate to be processed, in a processing space between first and second electrodes provided so as to face each other, to supply a high frequency electric power through a feeding position to said first electrode while feeding a process gas into said processing space, to form plasma in said processing space to plasma-process said substrate, the feeding position being a single position with respect to the first surface;

wherein said first electrode has a first surface and has a second surface that is opposite to said first surface, thereof and faces said second electrode, wherein the feeding position is moved on a first surface when a high frequency electric power is fed to said first surface of said first electrode to form plasma, and, wherein said moving mechanism substantially moves the feeding position of said feeding member on a circumference of a predetermined radius, which is concentric with said first electrode, on the first surface of said first electrode.

36. A plasma processing method as set forth in claim 35, wherein said feeding position moves at a moving speed of 20 rpm or higher.

37. A plasma processing method for arranging a substrate to be processed, in a processing space between first and second electrodes provided so as to face each other, to supply a high frequency electric power to said first electrode while feeding a process gas into said processing space, to form plasma in said processing space to plasma-process said substrate, wherein a plurality of receiving terminal portions are provided at positions other than the center on the opposite surface to the surface of said first electrode facing said second electrode, and a receiving terminal portion of said receiving terminal portions for receiving a high frequency electric power is sequentially switched when said high frequency electric power is fed to said first electrode to form plasma.

38. A plasma processing method as set forth in claim 37, wherein said receiving terminal portions are arranged on circumferences, and said receiving terminal portions are sequentially switched at a speed of 20 rpm or higher.

* * * * *